(12) United States Patent
Yan

(10) Patent No.: US 10,609,483 B2
(45) Date of Patent: Mar. 31, 2020

(54) METHOD FOR SOUND EFFECT COMPENSATION, NON-TRANSITORY COMPUTER-READABLE STORAGE MEDIUM, AND TERMINAL DEVICE

(71) Applicant: Guangdong Oppo Mobile Telecommunications Corp., Ltd., Dongguan, Guangdong (CN)

(72) Inventor: Bixiang Yan, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/229,420

(22) Filed: Dec. 21, 2018

(65) Prior Publication Data

US 2019/0306622 A1 Oct. 3, 2019

(30) Foreign Application Priority Data

Mar. 30, 2018 (CN) .......................... 2018 1 0277583

(51) Int. Cl.
*H03G 3/00* (2006.01)
*H04R 3/04* (2006.01)
*G10K 15/12* (2006.01)
*H03G 5/02* (2006.01)
*H04R 29/00* (2006.01)

(52) U.S. Cl.
CPC ............... *H04R 3/04* (2013.01); *G10K 15/12* (2013.01); *H03G 5/025* (2013.01); *H04R 29/00* (2013.01); *H04R 29/001* (2013.01); *H04R 2400/01* (2013.01); *H04R 2430/03* (2013.01)

(58) Field of Classification Search
CPC ....................................................... H03G 3/00
See application file for complete search history.

(56) References Cited

U.S. PATENT DOCUMENTS 10,460,095 B2 * 10/2019 Boesen ................... G06F 21/32
2006/0274901 A1 12/2006 Terai et al.
(Continued)

FOREIGN PATENT DOCUMENTS

| CN | 101794574 A | 8/2010 |
|----|-------------|--------|
| CN | 103677714 A | 3/2014 |

(Continued)

OTHER PUBLICATIONS

International search report issued in corresponding international application No. PCT/CN2018/116744 dated Feb. 22, 2019.
(Continued)

*Primary Examiner* — Olisa Anwah
(74) *Attorney, Agent, or Firm* — Young Basile Hanlon & MacFarlane, P.C.

(57) ABSTRACT

A method and an apparatus for sound effect compensation, a non-transitory computer-readable storage medium, and a terminal device are provided. The method includes the following. An acoustic transmission function of an audio processing device in an ear canal of a user is determined according to an audio signal currently output from the audio processing device. Compensate for the audio signal according to the acoustic transmission function.

17 Claims, 5 Drawing Sheets

Determining an acoustic transmission function of an audio processing device in an ear canal of a user according to an audio signal output from the audio processing device — 302

Compensating for the audio signal according to the acoustic transmission function — 304

(56) References Cited

U.S. PATENT DOCUMENTS

| | | | |
|---|---|---|---|
| 2007/0036377 A1* | 2/2007 | Stirnemann | H04R 25/505 381/315 |
| 2007/0195963 A1* | 8/2007 | Ko | H04S 7/306 381/26 |
| 2008/0219456 A1 | 9/2008 | Goldstein et al. | |
| 2011/0222696 A1 | 9/2011 | Balachandran et al. | |
| 2016/0127829 A1 | 5/2016 | Ring et al. | |
| 2017/0041724 A1 | 2/2017 | Master et al. | |

FOREIGN PATENT DOCUMENTS

| | | |
|---|---|---|
| CN | 107071626 A | 8/2017 |
| CN | 107566936 A | 1/2018 |
| WO | 2012169095 A1 | 12/2012 |

OTHER PUBLICATIONS

Extended European search report issued in corresponding European application No. 18208013.5 dated Jun. 18, 2019.

\* cited by examiner

Determining an acoustic transmission function of an audio processing device in an ear canal of a user according to an audio signal output from the audio processing device — 302

Compensating for the audio signal according to the acoustic transmission function — 304

METHOD FOR SOUND EFFECT COMPENSATION, NON-TRANSITORY COMPUTER-READABLE STORAGE MEDIUM, AND TERMINAL DEVICE

CROSS-REFERENCE TO RELATED APPLICATION(S)

This application claims priority to and the benefit of Chinese Application Patent Serial No. 201810277583.0, filed on Mar. 30, 2018, the entire disclosure of which is hereby incorporated by reference.

TECHNICAL FIELD

This disclosure relates to the technical field of audio, and more particularly to a method for sound effect compensation, a non-transitory computer-readable storage medium, and a terminal device.

BACKGROUND

With the development of science and technology, people's demand for a variety of electronic equipment is increasing and requirement on quality of the electronic equipment is also increasing. The high-quality listening experience has become a very important aspect in people's evaluation for audio input and output devices.

In general, in order to achieve a unified listening effect, audio processing devices of the same model of the same manufacturer have been subject to standardized tone calibration operation before shipped from the factory, that is, the audio processing devices have been set with a unified standard frequency-response curve. However, each person has unique ear pattern information, and therefore different sound effects will be produced for different users wearing the audio processing devices with the same frequency-response curve. Therefore, the audio processing devices manufactured by adopting a uniform standard frequency-response curve still unable to provide users with optimal listening effects.

SUMMARY

Embodiments of the disclosure provide a method for sound effect compensation, a non-transitory computer-readable storage medium, and a terminal device.

According to embodiments of the disclosure, a method for sound effect compensation is provided and includes the following. An acoustic transmission function of an audio processing device in an ear canal of a user is determined according to an audio signal output from the audio processing device. Compensate for the audio signal according to the acoustic transmission function.

According to embodiments of the disclosure, a terminal device is provided. The terminal device at least one processor and a computer readable storage. The computer readable storage is coupled to the at least one processor and is configured to store at least one computer executable instruction thereon which, when executed by the at least one processor, cause the at least one processor to carry out actions, including: determining an acoustic transmission function of an audio processing device in an ear canal of a user according to an audio signal output from the audio processing device; compensating for the audio signal according to the acoustic transmission function.

According to embodiments of the disclosure, a non-transitory computer-readable storage medium is provided. The non-transitory computer-readable storage medium is configured to store a computer program which, when executed by a processor, causes the processor to carry out actions, including: determining an acoustic transmission function of an audio processing device in an ear canal of a user according to an audio signal output from the audio processing device; compensating for the audio signal according to the acoustic transmission function.

BRIEF DESCRIPTION OF DRAWINGS

To describe technical solutions in embodiments of the present disclosure or in the related art more clearly, the following briefly introduces the accompanying drawings required for describing the embodiments or the related art. Apparently, the accompanying drawings in the following description illustrate some embodiments of the present disclosure. Those of ordinary skill in the art may also obtain other drawings based on these accompanying drawings without creative efforts.

DETAILED DESCRIPTION

Objects, technical solutions, and advantages of the embodiments of the present disclosure will be described clearly hereinafter through embodiments with reference to the accompanying drawings. It will be appreciated that the embodiments are described herein for the purpose of explaining the disclosure rather than limiting the disclosure.

The terms "first" and "second" used in the herein may be used to describe various elements, but these elements are not limited by these terms. These terms are only used to distinguish one element from another. For example, without departing from the scope of the present disclosure, the first acquiring unit may be referred to as a second acquiring unit, and similarly, a second acquiring unit may be referred to as a first acquiring unit. Both the first acquiring unit and the second acquiring unit are acquiring units, but they are not the same acquiring unit.

Figure 1:
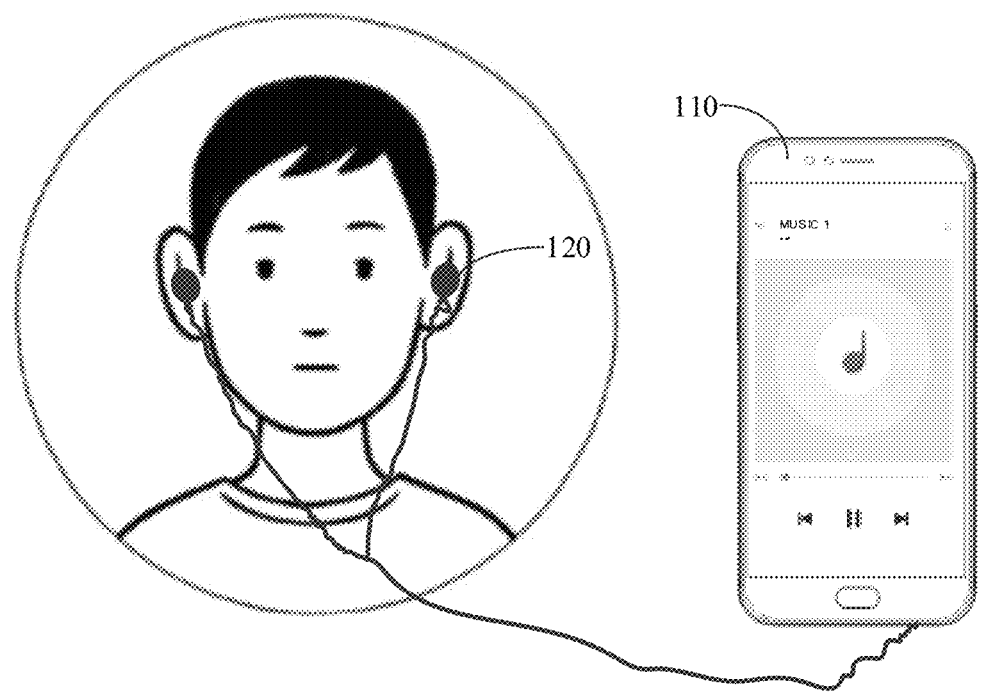
FIG. 1 is a schematic diagram illustrating an application scenario of a method for sound effect compensation according to an embodiment of the present disclosure.

FIG. 1 is a schematic diagram illustrating an application scenario of a method for sound effect compensation according to an embodiment of the present disclosure. As illustrated in FIG. 1, the application scenario relates to a terminal device 110 and an audio processing device 120 in communication with the terminal device 110. The audio processing device 120 may be worn on user's ear.

According to embodiments of the disclosure, the audio processing device 120 may be a headphone or an electronic device that can acquire and play audio signals. In case that the audio processing device 120 is a headphone, the headphone may be an earplug-type headphone, an in-ear headphone, an over-ear headphone, or an ear-hook headphone. The terminal device 110 and the audio processing device 120 can implement data transmission by means of wired communication or wireless communication. The wireless communication refers to replacing audio line transmission with radio wave transmission, where an audio outlet of the terminal device is coupled to a transmit end, and data are transmitted from the transmit end to a receive end of the audio processing device 120 through radio waves. There are three types of wireless communication, that is, Bluetooth® communication, infrared communication, and 2.4 G communication.

Figures 2, 3:
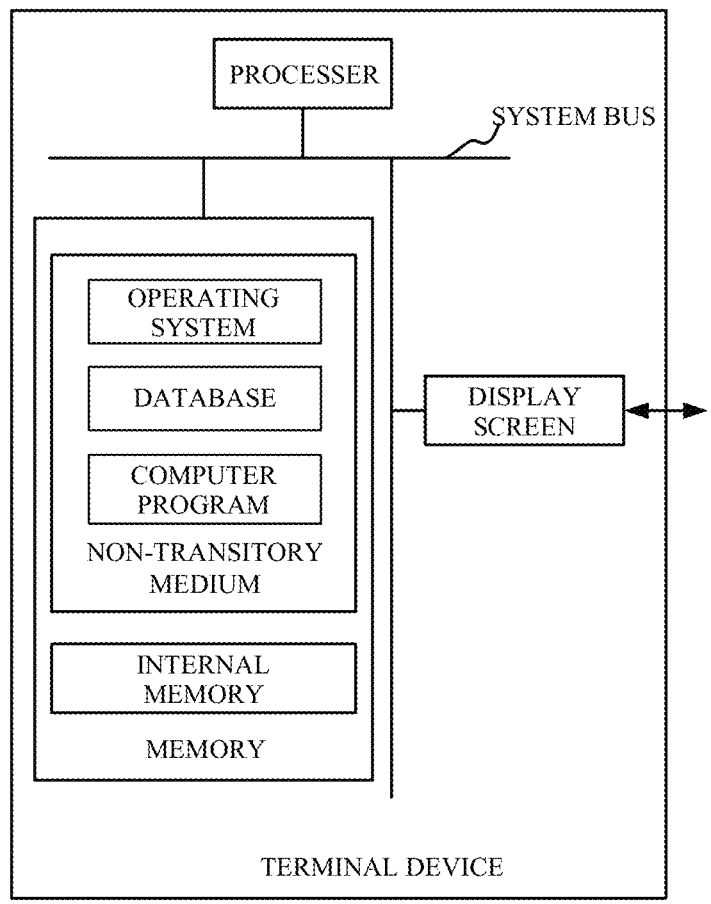
FIG. 2 is a schematic structural diagram illustrating an inner structure of a terminal device according to an embodiment of the present disclosure.
FIG. 3 is a schematic flow chart illustrating a method for sound effect compensation according to an embodiment of the present disclosure.

FIG. 2 is a schematic structural diagram illustrating an inner structure of a terminal device according to an embodiment of the present disclosure. The terminal device 110 includes a processor, a memory, and a display screen that are coupled with each other via a system bus. The processor is configured to provide computation and control functions to support the operation of the terminal device 110. The memory is configured to store data, programs, and/or instruction codes, etc. At least one computer program is stored in the memory. The least one computer program is operable with the processor to implement the method for sound effect compensation, which is applicable to the terminal device 110, according to the embodiments of the disclosure. The memory can include a non-transitory storage medium such as a magnetic disk, a compact disk (CD), a read-only memory (ROM), or a random-access-memory (RAM) and so on. For example, in one implementation, the memory includes a non-transitory storage medium and an internal memory. The non-transitory storage medium is configured to store an operating system, a database, and computer programs. The database is configured to store related data to implement the method for processing audio signals according to the embodiments of the present disclosure. The computer programs are operable with the processor to implement the method for sound effect compensation according to the embodiments of the present disclosure. The internal memory is configured to provide a caching operating environment for the operating system, the database, and the computer programs in the non-transitory storage medium. The display screen may be a touch screen, such as a capacitive touch screen or a resistive touch screen, and is configured to display interface information of the terminal device 110. The display screen can be operable in a screen-on state and screen-off state. The terminal device 110 may be a mobile phone, a tablet PC, a personal digital assistant (PDA), a wearable device, or the like.

Those skilled in the art can understand that the structure illustrated in the block diagram of FIG. 2 is only a partial structure related to the technical solutions of the present disclosure and does not constitute any limitation on the terminal device 110 to which the technical solutions of the present disclosure are applied. The terminal device 110 can include more or fewer components than illustrated in the figures or be provided with different components, or certain components can be combined.

FIG. 3 is a schematic flow chart illustrating a method for sound effect compensation according to an embodiment of the present disclosure. The method in this embodiment for example is implemented on the terminal device or the audio processing device illustrated in FIG. 1. As illustrated in FIG. 3, the method begins at block 302.

At block 302, an acoustic transmission function of the audio processing device in an ear canal of a user is determined according to an audio signal currently output from the audio processing device.

When the audio processing device currently outputs an audio signal, an acoustic echo signal is formed as a result of reflection and vibration of the audio signal through the ear canal. According to the audio signal played and the acoustic echo signal acquired, the acoustic transmission function corresponding to a current position of the audio processing device in the ear canal of the user can be determined. The acoustic transmission function is configured to characterize spatial features of the user's ear canal coupled with the audio processing device, that is, user's ear pattern features. Further, when the audio processing device is placed in the ear canal, the acoustic transmission function can also characterize position information of the audio processing device at different positions in the user's ear canal.

It will be understood that, the audio signal may be a multimedia file currently played, a voice signal of the user himself/herself or a contact during the call, or an audio signal beyond the normal human hearing range. For example, in case that the audio signal is higher than 20 KHz, the user is unable to hear the audio signal even if the audio processing device is placed in the user's ear.

At block 304, compensate for the audio signal according to the acoustic transmission function.

According to the above-described method of the disclosure, according to the audio signal currently output from the audio processing device, the acoustic transmission function of the audio processing device in the user's ear canal is determined. Compensate for the audio signal according to the acoustic transmission function. In this way, the user's ear pattern information can be obtained according to the audio signal currently output from the audio processing device to compensate for the tone of the audio signal, thereby adapting to users with different ear pattern information and providing different users with better listening experience.

Figure 4:
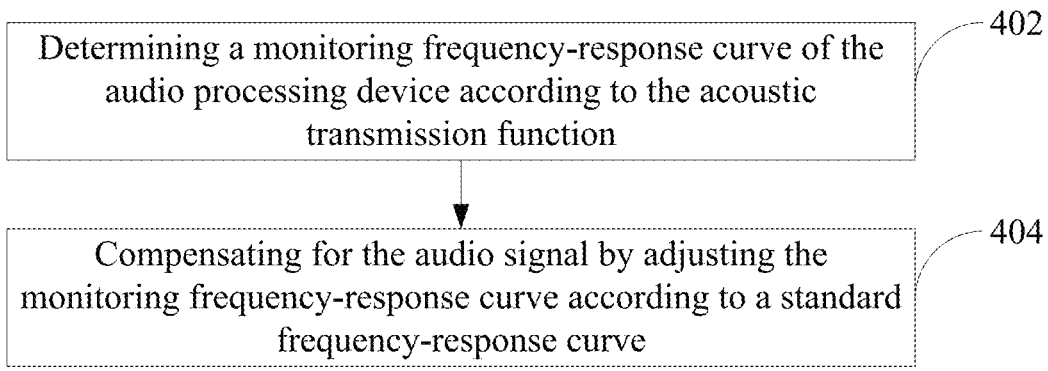
FIG. 4 is a schematic flow chart illustrating a process of determining an acoustic transmission function of an audio processing device in an ear canal of a user according to an audio signal currently output from the audio processing device according to an embodiment of the present disclosure.

As illustrated in FIG. 4, in one implementation, compensate for the audio signal according to the acoustic transmission function as follows.

At block 402, a monitoring frequency-response curve corresponding to the current position of the audio processing device is determined according to the acoustic transmission function.

According to a corresponding relationship among acoustic echo signals, acoustic transmission functions, and monitoring frequency-response curves, the monitoring frequency-response curve corresponding to the acoustic transmission function can be acquired.

The monitoring frequency-response curve can be determined according to an acoustic echo signal formed by reflection and vibration of the audio signal currently output from the audio processing device through the ear canal. According to the audio signal played and the acoustic echo signal acquired, the acoustic transmission function corresponding to the current position of the audio processing device in the ear canal of the user can also be determined. When the audio processing device is placed at different positions of the user's ear canal, acoustic echo signals are different. While determining the acoustic transmission function, the audio processing device can also determine the monitoring frequency-response curve corresponding to the current position of the audio processing device according to the recorded acoustic echo signal, and further establish a corresponding relationship among acoustic echo signals, acoustic transmission functions, and monitoring frequency-response curves.

At block 404, compensate for the audio signal by adjusting the monitoring frequency-response curve according to a standard frequency-response curve.

Compare the monitoring frequency-response curve determined with the standard frequency-response curve to acquire a difference between the standard frequency-response curve and the monitoring frequency-response curve. Compensate for the monitoring frequency-response curve according to the difference and further conduct sound effect compensation on the audio signal. In one implementation, according to difference data between the standard frequency-response curve and the monitoring frequency-response curve, adjust the monitoring frequency-response curve by adjusting a gain frequency point of an equalizer (EQ) and a gain value of the gain frequency point, thereby realizing the sound effect compensation for the audio signal.

According to the above-described method of the disclosure, according to the audio signal currently output from the audio processing device, the acoustic transmission function of the audio processing device in the user's ear canal is determined. The monitoring frequency-response curve corresponding to the current position of the audio processing device is determined according to the acoustic transmission function. The monitoring frequency-response curve is compared with the standard frequency-response curve to compensate for the audio signal. In this way, the user's ear pattern information and the monitoring frequency-response curve corresponding to the ear pattern information can be obtained according to the audio signal currently output from the audio processing device, and the monitoring frequency-response curve may be automatically adjusted according to the standard frequency-response curve to compensate for the tone of the audio signal, thereby adapting to users with different ear pattern information and providing different users with better listening experience.

Figure 5:
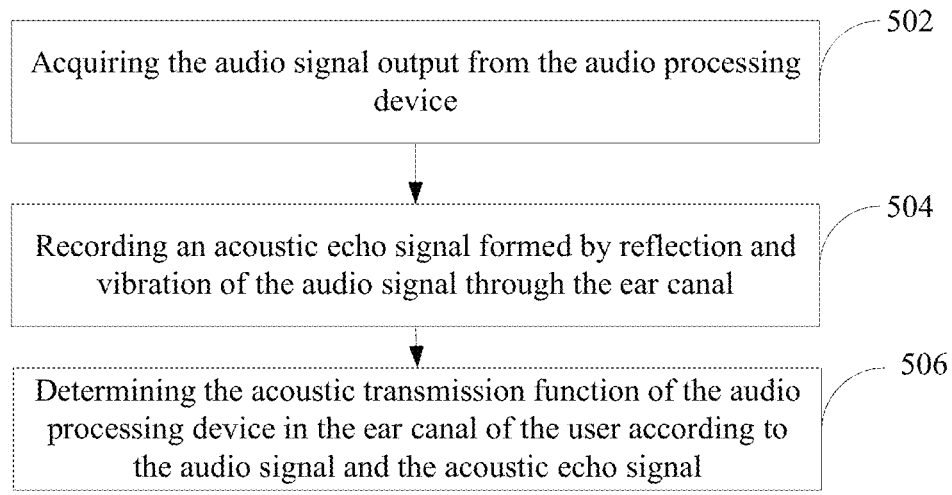
FIG. 5 is a schematic flow chart illustrating a process of analyzing a monitoring frequency-response curve of the audio processing device according to the acoustic transmission function according to an embodiment of the present disclosure.

As illustrated in FIG. 5, in one implementation, determine the acoustic transmission function of the audio processing device in the user's ear canal according to the audio signal currently output from the audio processing device as follows.

At block 502, acquire the audio signal output by the audio processing device.

The audio signal output by the audio processing device can be controlled by a terminal device coupled with the audio processing device. The terminal device controls the audio processing device to output a corresponding audio signal and acquires the audio signal currently output from the audio processing device. The audio signal may be a music signal or sound signal when an application (music, video, game, call, etc.) plays a multimedia file, or a sound signal beyond the user's hearing range. In one implementation, the audio signal can also be a voice signal of the user himself/herself or a contact when the user talks through the audio processing device.

At block 504, an acoustic echo signal formed by reflection and vibration of the audio signal through the ear canal is recorded.

The audio processing device includes a speaker. The speaker can convert electrical signals corresponding to the audio signal to acoustic wave signals that the user can hear. The speaker is very sensitive to acoustic waves in the user's ear canal. The acoustic waves can cause the vibration of a speaker cone and drive a coil connected to the speaker cone to perform motion of cutting magnetic lines in a magnetic field of a permanent magnet, thereby inducing a current that varies with the acoustic waves (physically called electromagnetic induction. In addition, electromotive forces of the audio signal will be output at both ends of the coil. Therefore, the speaker can record the acoustic echo signal formed by the reflection and vibration of the audio signal through the ear canal. In other words, the speaker can be used as a microphone.

In one implementation, the acoustic echo signal formed by the reflection and the vibration of the audio signal through the ear canal can be recorded by the speaker configured to play the audio signal, and there is no need to provide an additional microphone in the audio processing device, which can save cost and simplify the internal structure of the audio processing device.

In one implementation, the acoustic echo signal formed by the reflection and the vibration of the audio signal through the ear canal can also be recorded with a microphone of the audio processing device. When the audio processing device is worn on the user's ear, the microphone of the audio processing device is placed on one side of the audio processing device that is in contact with the internal structure of the user's ear, that is, the microphone is disposed on a housing of the audio processing device on which a through hole of a speaker is disposed.

At block 506, determine the acoustic transmission function of the audio processing device in the user's ear canal according to the audio signal and the acoustic echo signal.

The acoustic transmission function can be expressed as the following:

$$r(t)=s(t)*W(t) \qquad (1)$$

where $r(t)$ represents the acoustic echo signal which is recorded by the electroacoustic transducer and is formed by the reflection and the vibration of the audio signal through the ear canal, $s(t)$ represents the audio signal currently output from the audio processing device, and $W(t)$ represents the acoustic transmission function associated with the current position of the audio processing device in the user's ear canal. The acoustic transmission function $W(t)$ can be understood as spatial features of the internal structure of the user's ear canal where the audio processing device is currently placed or can also be understood as the user's ear pattern features. That is, different acoustic transmission functions $W(t)$ can be used to characterize different positions of the audio processing device in user's ear canal.

According to formula (1), determine the acoustic transmission function $W(t)$ for indicating the current position of the audio processing device in the user's ear canal, where W(t)=r(t)/s(t). In formula (1), the audio signal s(t) and the acoustic echo signal r(t) can be obtained by an audio circuit arranged in the audio processing device or in the terminal device.

Further, when a noise signal is considered, a noise factor e(t) may be introduced to the above formula (1). The noise factor e(t) represents ambient noise and circuit noise. The ambient noise is generated during recording of the acoustic echo signal when no audio signal s(t) is played. The ambient noise can be acquired by an additional microphone. The circuit noise is caused by the built-in circuit of the audio processing device and is an inherent property of the audio processing device. The noise factor e(t) is an already known parameter. After introduced the noise factor e(t), the above formula (1) may be revised to:

$$r(t)=s(t)*W(t)+e(t) \quad (2)$$

In formula (2), the noise factor e(t), the audio signal s(t), and the acoustic echo signal r(t) are all already known parameters or can be recorded, and thus the acoustic transmission function W(t) can be obtained accordingly.

Figure 6:
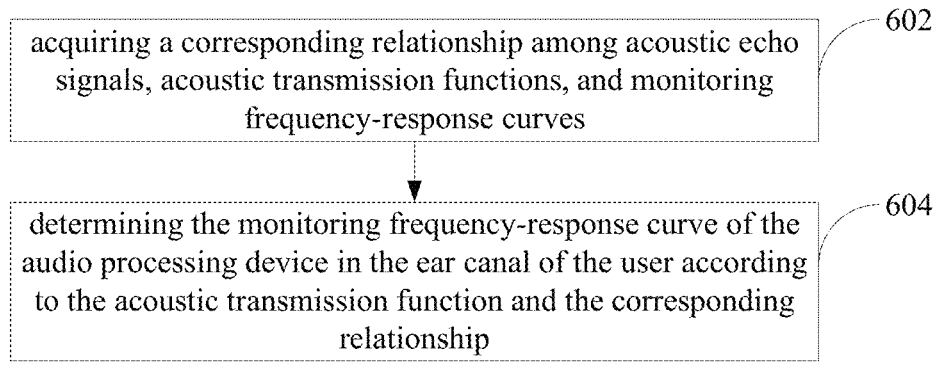
FIG. 6 is a schematic flow chart illustrating a process of compensating for the audio signal by adjusting the monitoring frequency-response curve according to a standard frequency-response curve according to an embodiment of the present disclosure.

As illustrated in FIG. 6, in one implementation, determine the monitoring frequency-response curve of the audio processing device according to the acoustic transmission function as follows.

At block 602, a corresponding relationship among acoustic echo signals, acoustic transmission functions, and monitoring frequency-response curves is acquired.

At block 604, the monitoring frequency-response curve of the audio processing device in the ear canal of the user is determined according to the acoustic transmission function and the corresponding relationship.

As an implementation, the method can further include the following.

Establish a corresponding relationship among acoustic echo signals, acoustic transmission functions, and monitoring frequency-response curves.

When the audio processing device outputs the audio signal, the acoustic echo signal is formed after reflection and the vibration of the audio signal through the ear canal. The speaker or the microphone of the audio processing device acquires the acoustic echo signal, and then the audio processing device or the terminal device generates the monitoring frequency-response curve by analyzing the acoustic echo signal acquired.

In a test circuit, the frequency of an output signal of a signal generator is continuously changed (i.e., commonly referred to as "frequency sweep") and the amplitude of the output signal is kept unchanged. By recording output levels for such continuous changing through an oscilloscope or some other recorders at an output end, a curve corresponding to the frequencies and levels can be plotted in one coordinate, which is called a frequency-response curve.

The acoustic transmission function can be determined according to the audio signal and the acoustic echo signal formed by the reflection and the vibration of the audio signal through the ear canal, that is, acoustic transmission functions and acoustic echo signals are in one-to-one correspondence. At the same time, the monitoring frequency-response curve can be determined according to the acoustic echo signal, that is, monitoring frequency-response curves and acoustic echo signals are in one-to-one correspondence. Based on the above, the corresponding relationship among the acoustic echo signals, the acoustic transmission functions, and the monitoring frequency-response curves can be established, and then we can see monitoring frequency-response curves and acoustic transmission functions are also in one-to-one correspondence.

Since the monitoring frequency-response curves and the acoustic transmission functions are in one-to-one correspondence and the acoustic transmission function can be used to characterize position information of the audio processing device or ear pattern information of a user, the monitoring frequency-response curve of the audio processing device at the current position can be determined according to the corresponding relationship. That is, the monitoring frequency-response curve is determined by structural properties of the audio processing device and the current position of the audio processing device in the user's ear canal. Accordingly, the monitoring frequency-response curve is formed by an original first frequency-response curve of the audio processing device and a second frequency-response curve corresponding to user's ear canal information. Since each user has unique ear pattern information, when the same audio processing device is placed in ear canals of different users, monitoring frequency-response curves obtained are also different. If the obtained monitoring frequency-response curves are not adjusted, audio processing devices with the same tone standard (that is, unified setting of frequency-response curve and EQ gain) cannot provide different users with the best listening effect.

Figure 7:
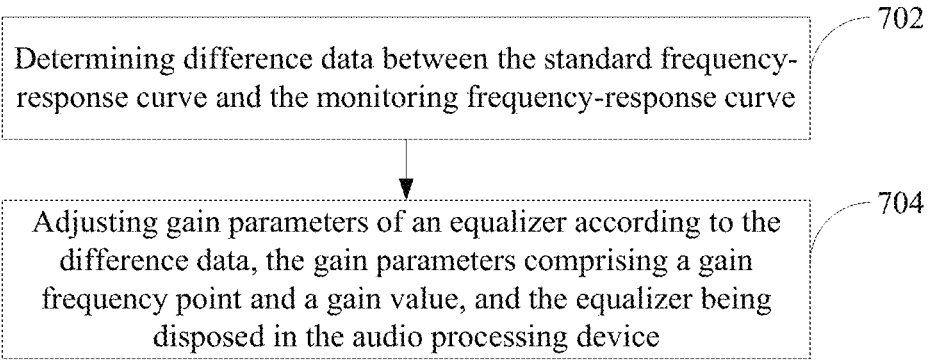
FIG. 7 is a schematic flow chart illustrating a method for sound effect compensation according to another embodiment of the present disclosure.

As illustrated in FIG. 7, in one implementation, compensate for the audio signal by adjusting the monitoring frequency-response curve according to the standard frequency-response curve as follows.

At block 702, difference data between the standard frequency-response curve and the monitoring frequency-response curve are determined.

The standard frequency-response curve can be customized as needed or can be determined according to data statistics, which is not further limited herein.

Compare the monitoring frequency-response curve with the standard frequency-response curve to determine the difference data between the two curves. In one implementation, abscissas of the monitoring frequency-response curve and the standard frequency-response curve correspond to "frequency", and ordinates corresponding to "gain value". A difference between a gain value corresponding to the standard frequency-response curve and a gain value corresponding to the monitoring frequency-response curve at a same frequency point is acquired by comparing the two curves. Judge whether the difference is within a preset range and determine the difference as the difference data when the difference exceeds the preset range.

At block 704, adjust gain parameters of an EQ according to the difference data, where the gain parameters include a gain frequency point and a gain value.

In one implementation, adjust the gain parameters of the EQ according to the difference data acquired, where the gain parameters include the gain frequency point and the gain value. The basic function of the EQ is to adjust the tone by gaining or attenuating one or more frequency bands of the sound. The EQ includes following three parameters: a frequency parameter for setting a frequency point to be adjusted, a gain parameter for conducting amplification or attenuation on a frequency point set in advance, and a bandwidth ratio parameter for setting "width" of a frequency band that needs gain or attenuation. The EQ can be disposed in the audio processing device.

For example, at the same frequency point, if the gain value corresponding to the monitoring frequency-response curve is higher than the gain value corresponding to the standard frequency-response curve, a gain value of the equalizer at this frequency point is then decreased so that the gain value of the monitoring frequency-response curve conforms to the gain value of the standard frequency-response curve. On the other hand, at the same frequency point, if the gain value corresponding to the monitoring frequency-response curve is lower than the gain value corresponding to the standard frequency-response curve, a gain value of the equalizer at this frequency point is then increased so that the gain value of the monitoring frequency-response curve conforms to the gain value of the standard frequency-response curve.

According to the embodiment of the disclosure, the monitoring frequency-response curve related to the user's ear pattern information can be automatically adjusted according to the standard frequency-response curve, so as to compensate for the tone of the audio signal, thereby adapting to users with different ear pattern information and providing the user with better listening experience.

Figure 8:
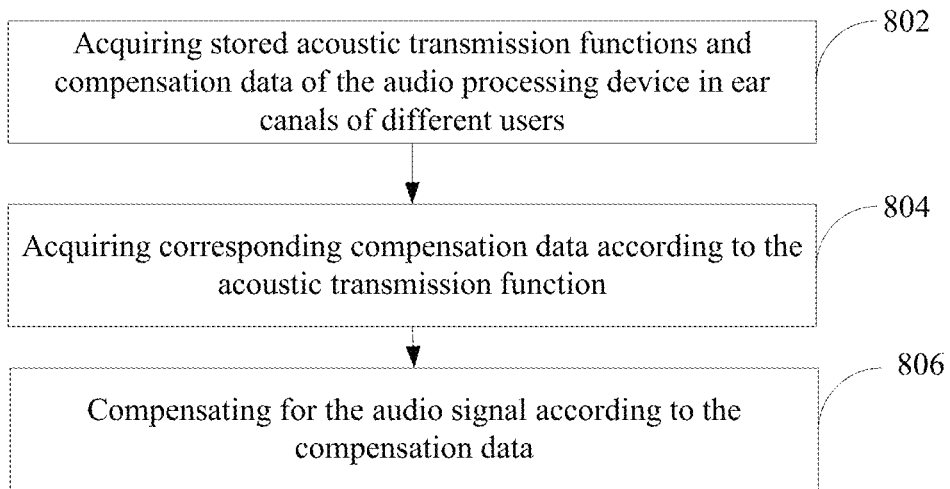
FIG. 8 is a schematic flow chart illustrating a method for sound effect compensation according to yet another embodiment of the present disclosure.

As illustrated in FIG. 8, in one implementation, compensate for the audio signal according to the acoustic transmission function as follows.

At block 802, acoustic transmission functions and compensation data of the audio processing device in ear canals of different users are acquired and stored.

Each user has his own acoustic transmission functions, and accordingly each user has unique ear pattern features, that is, corresponds to a unique monitoring frequency-response curve. For user A, the monitoring frequency-response curve can be adjusted by adjusting the gain parameters of the EQ according to the standard frequency-response curve (the compensation data refer to the gain parameters that the EQ needs to adjust), so as to compensate for the tone of the audio signal, thereby adapting to the user A and providing the user A with better listening experience.

In one implementation, acoustic transmission functions of multiple users and compensation data corresponding to the acoustic transmission functions may be acquired. The acoustic transmission functions and the compensation data may be stored in the database.

At block 804, corresponding compensation data are acquired according to an acoustic transmission function of a current user.

When the audio processing device is placed in the ear canal of the user, an acoustic transmission function characterizing the user's ear pattern information is automatically recognized according to the audio signal output from the audio processing device, and corresponding compensation data in the database are acquired according to the acoustic transmission function.

At block 806, compensate for the audio signal according to the compensation data.

According to the acquired compensation data, that is, the gain parameters that the EQ needs to adjust, the gain parameters of the EQ are adjusted to compensate for the output audio signal, so as to compensate for the tone of the audio signal, thereby providing the current user with better listening experience.

According to the method of the embodiments, when the audio processing device is used by different users, the gain parameters of the EQ may be adjusted according to the acoustic transmission function of the current user to quickly and effectively compensate for the output audio signal, thereby providing the current user with the best listening experience.

Figure 9:
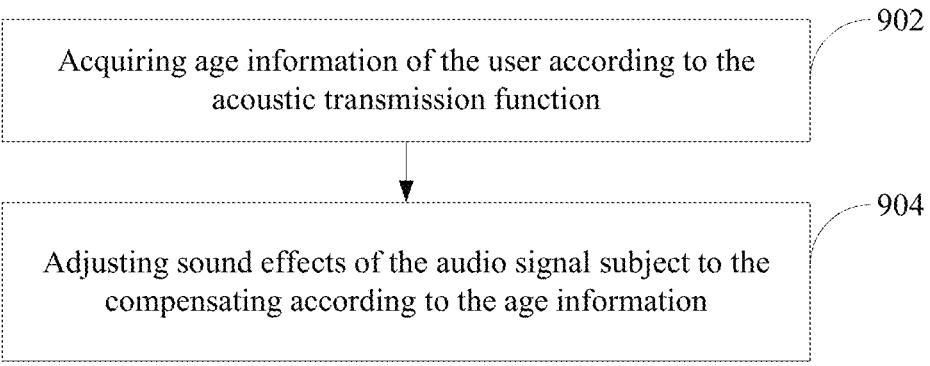
FIG. 9 is a schematic flow chart illustrating a method for sound effect compensation according to an embodiment of the present disclosure.

As illustrated in FIG. 9, in one implementation, the method further includes the following.

At block 902, acquire age information of the user according to the acoustic transmission function.

According to the acoustic transmission function, the user's ear pattern information can be obtained, according to which user's identity information can be further obtained, where the identity information includes user's name, workplace, address, contact information, date of birth, and so on. The user's age information can be acquired according to his or her date of birth.

It should be noted that the user's age information may also be input by the user. Acquiring of the age information is not limited to the above method.

At block 904, adjust sound effects of the audio signal subject to compensation according to the age information.

Acquire a correction parameter corresponding to the age information from a preset database, form a correction command according to the correction parameter to adjust a gain parameter of the EQ, and further adjust sound effects of the audio signal to adapt to a hearing condition corresponding to user's age, thereby helping the user to hear the audio signal more clearly and with better sound effects. For example, older people are weak in high-frequency hearing, so if the high frequency portion of the output audio signal can be adjusted by adjusting the gain parameters of the EQ, the older people may hear the audio signal more clearly and with better sound effects.

It should be understood that although the various steps in the flow charts of FIGS. 1-8 are sequentially displayed as indicated by the arrows, these steps are not necessarily performed in the order indicated by the arrows. Except as explicitly stated herein, the execution of these steps is not strictly limited, and the steps may be performed in other orders. Moreover, at least some of the steps in FIGS. 1-9 may include multiple sub-steps or multiple stages, which are not necessarily performed at the same time, and can be performed at different times, the order of execution of these sub-steps or stages is not necessarily performed sequentially, and can be performed in turn or alternately with at least a part of other steps or sub-steps or stages of other steps.

An apparatus for sound effect compensation is also provided according to an embodiment of the present disclosure. The apparatus for sound effect compensation is applicable to a terminal device. The terminal device is coupled with an audio processing device. The apparatus for sound effect compensation includes a determining module and a compensating module.

The determining module is configured to determine an acoustic transmission function of an audio processing device in an ear canal of a user according to an audio signal currently output from the audio processing device.

The compensating module is configured to compensate for the audio signal according to the acoustic transmission function.

According to the above apparatus, the acoustic transmission function corresponding to the current position of the audio processing device in user's ear canal can be determined according to an audio signal currently output from the audio processing device. Compensate for the audio signal according to the acoustic transmission function. In this way, the user's ear pattern information can be obtained according to the audio signal currently output from the audio processing device to compensate for the tone of the audio signal, thereby adapting to users with different ear pattern information and providing different users with better listening experience.

In one implementation, the compensating module includes a first determining unit and a first compensating unit.

The first determining unit is configured to determine a monitoring frequency-response curve of the audio processing device according to the acoustic transmission function.

The first compensating unit is configured to compensate for the audio signal by adjusting the monitoring frequency-response curve according to a standard frequency-response curve.

In one implementation, the determining module includes a first acquiring unit, a recording unit, and a second determining unit. The first acquiring unit is configured to acquire the audio signal output from the audio processing device. The recording unit is configured to record an acoustic echo signal formed by reflection and vibration of the audio signal through the ear canal. The second determining unit is configured to determine the acoustic transmission function of the audio processing device in the ear canal of the user according to the audio signal and the acoustic echo signal.

In one implementation, the first determining unit is further configured to acquire a corresponding relationship among acoustic echo signals, acoustic transmission functions, and monitoring frequency-response curves; determine the monitoring frequency-response curve of the audio processing device in the ear canal of the user according to the acoustic transmission function and the corresponding relationship.

In one implementation, the first compensating unit includes a third determining sub-unit and an adjusting sub-unit. The third determining sub-unit is configured to determine difference data between the standard frequency-response curve and the monitoring frequency-response curve. The adjusting sub-unit is configured to adjust gain parameters of an EQ according to the difference data, where the gain parameters include a gain frequency point and a gain value.

In one implementation, the third determining sub-unit is further configured to judge whether a difference between a gain value corresponding to the standard frequency-response curve and a gain value corresponding to the monitoring frequency-response curve at a same frequency point is within a preset range and is further configured to determine difference as the difference data based on a judgment that the difference is not within the preset range.

In one implementation, the apparatus further includes an age compensating module. The age compensating module is configured to acquire age information of the user according to the acoustic transmission function and to adjust sound effects of the audio signal subject to the compensating according to the age information.

In one implementation, the compensating module further includes a second acquiring unit and a second compensating unit. The second acquiring unit is configured to acquire stored acoustic transmission functions and compensation data of the audio processing device in ear canals of different users; acquire corresponding compensation data according to the acoustic transmission function. The second compensating unit is configured to compensate for the audio signal according to the compensation data.

The division of each module in the above-mentioned apparatus for sound effect compensation is for illustrative purposes only. In other embodiments, the apparatus for sound effect compensation may be divided into different modules as needed to complete all or part of the functions of the above-mentioned apparatus for sound effect compensation.

For the specific definition of the apparatus for sound effect compensation, reference may be made to the definition of the method for sound effect compensation, and details are not described herein again. Each of the above-mentioned modules of the apparatus for sound effect compensation can be implemented in whole or in part by software, hardware, and combinations thereof. Each of the above modules may be embedded in or independent of the processor in the computer device, or may be stored in a memory in the computer device in a software form, so that the processor can invoke and execute the operations corresponding to the above modules.

The implementation of each module of the apparatus for sound effect compensation provided in the embodiments of the present disclosure may be in the form of a computer program. The computer program can run on a terminal device or a server. The program modules of the computer program can be stored in the memory of the terminal device or server. When the computer program is executed by the processor, the operations of the method described in the embodiments of the present disclosure are executed.

Embodiments of the disclosure further provide a non-transitory computer-readable storage medium. The non-transitory computer-readable storage medium is configured to store a computer program which, when executed by a processor, causes the processor to carry out the operations of the method for sound effect compensation.

Embodiments of the disclosure further provide a computer program product. The computer program product contains instructions which, when executed by the computer, are operable with the computer to perform the method for sound effect compensation.

Figure 10:
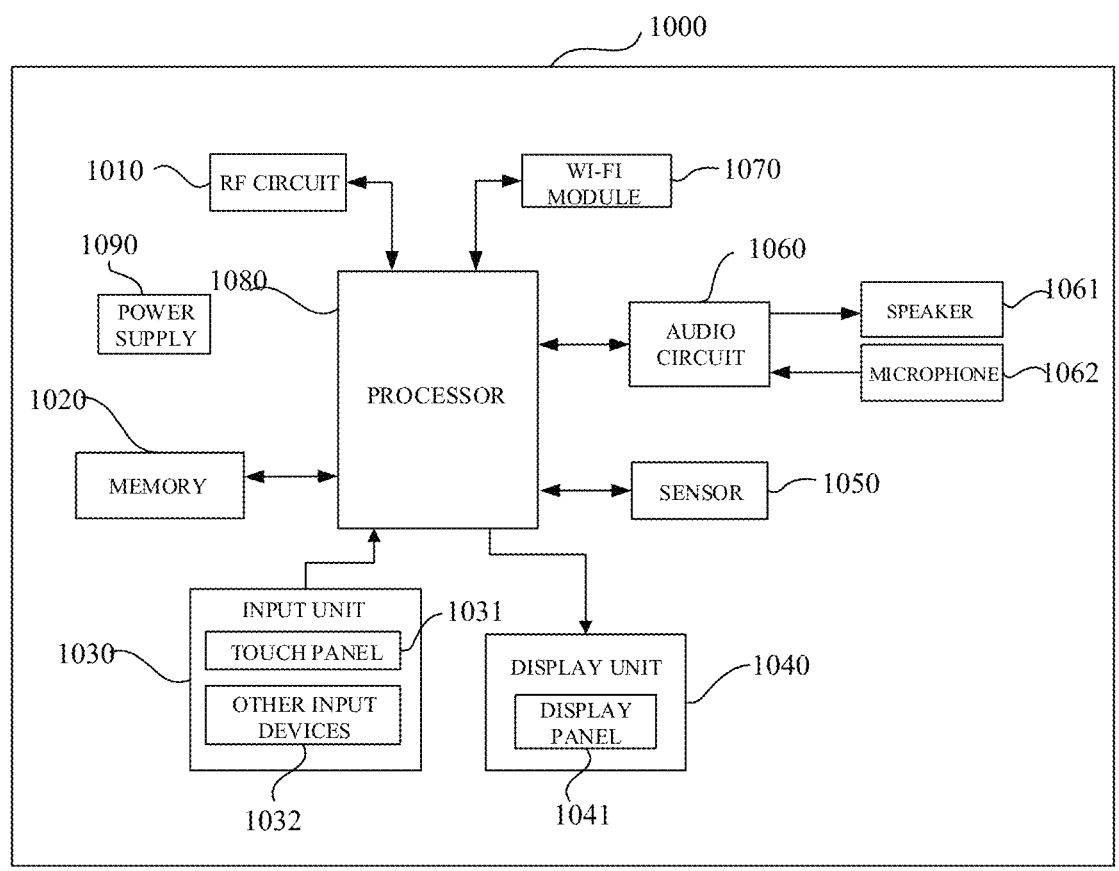
FIG. 10 is a block diagram illustrating a partial structure of a mobile phone related to a terminal device according to an embodiment of the disclosure.

Embodiments of the disclosure further provide a terminal device. As illustrated in FIG. 10, only parts related to the embodiments of the present disclosure are illustrated for convenience of description. For technical details not described, reference may be made to the method embodiments of the present disclosure. The terminal device may be any terminal device, such as a mobile phone, a tablet PC, a PDA, a point of sale terminal device (POS), an on-board computer, a wearable device, and the like. The following will describe the mobile phone as an example of the terminal device.

FIG. 10 is a block diagram of a part of a structure of a mobile phone related to a terminal device according to an embodiment of the present disclosure. As illustrated in FIG. 10, the mobile phone includes radio frequency (RF) circuit 1010, a memory 1020, an input unit 1030, a display unit 1040, a sensor 1050, an audio circuit 1060, a wireless fidelity (Wi-Fi) module 1070, a processor 1080, a power supply 1090, and other components. Those skilled in the art can understand that the structure of the mobile phone illustrated in FIG. 10 does not constitute any limitation on a mobile phone. The mobile phone configured to implement technical solutions of the disclosure may include more or fewer components than illustrated, combine certain components, or have different component configuration.

The RF circuit 1010 is configured to receive or transmit information, or receive or transmit signal during a call. Specifically, the RF circuit 1010 is configured to receive downlink information of a base station, which will be processed by the processor 1080. In addition, the RF circuit 1010 is configured to transmit uplink data to the base station. Generally, the RF circuit 1010 includes but is not limited to an antenna, at least one amplifier, a transceiver, a coupler, a low noise amplifier (LNA), a duplexer and the like. In addition, the RF circuit 1010 may also communicate with the network and other devices via wireless communication. The above wireless communication may use any communication standard or protocol, which includes but is not limited to global system of mobile communication (GSM), general packet radio service (GPRS), code division multiple access (CDMA), wideband code division multiple access (WCDMA), long term evolution (LTE), E-mail, short messaging service (SMS) and so on.

The memory 1020 is configured to store software programs and modules. The processor 1080 is configured to execute various function applications and data processing of the mobile phone by running the software programs and the modules stored in the memory 1020. The memory 1020 can mainly include a program storage area and a data storage area. The program storage area may store an operating system, applications required for at least one function (such as sound playback function, image playback function, etc.). The data storage area may store data (such as audio data, a phone book, etc.) created according to use of the mobile phone, and so on. In addition, the memory 1020 can include a high-speed RAM, and may further include a non-transitory memory such as at least one disk storage device, a flash device, or other non-transitory solid storage devices.

The input unit 1030 may be configured to receive input digital or character information and generate key signal input associated with user setting and function control of the mobile phone 1000. As one implementation, the input unit 1030 can include a touch panel 1031 and other input devices 1032. The touch panel 1031 can be known as a touch screen, collect touch operations generated by the user touching the touch panel 1031 or areas near the touch panel 1031 (such as operations generated by the user using any suitable object or accessory such as a finger or a stylus to touch the touch panel 1031 or areas near the touch panel 1031), and drive a corresponding connection device according to a preset program. In one implementation, the touch panel 1031 can include two parts of a touch detection device and a touch controller. The touch detection device is configured to detect the user's touch orientation and a signal brought by the touch operation, and transmit the signal to the touch controller. The touch controller is configured to receive the touch information from the touch detection device, convert the touch information to contact coordinates, and transmit the contact coordinates to the processor 1080 again. The touch controller can also receive and execute commands from the processor 1080. In addition, the touch panel 1031 may be implemented in various types such as resistive, capacitive, infrared, surface acoustic waves, etc. In addition to the touch panel 1031, the input unit 1030 may further include other input devices 1032. Specifically, the input devices 1032 include, but are not limited to, one or more of a physical keyboard, function keys (such as volume control buttons, switch buttons, etc.).

The display unit 1040 can be configured to display information input by the user, information provided for the user, or various menus of the mobile phone. The display unit 1040 can include a display panel 1041. In an implementation, the display panel 1041 may be in the form of a liquid crystal display (LCD), an organic light-emitting diode (OLED) and so on. In an implementation, the touch panel 1031 may cover the display panel 1041. After the touch panel 1031 detects a touch operation on or near the touch panel 1031, the touch panel 1031 transmits the touch operation to the processor 1080 to determine a type of the touch event, and then the processor 1080 provides a corresponding visual output on the display panel 1041 according to the type of the touch event. Although in FIG. 10, the touch panel 1031 and the display panel 1041 function as two independent components to implement the input and input functions of the mobile phone. In some implementations, the touch panel 1031 and the display panel 1041 may be integrated to achieve the input and output functions of the mobile phone.

The mobile phone 1000 can further include at least one type of sensor 1050, such as a light sensor, a motion sensor, and other sensors. As one implementation, the light sensor can include an ambient light sensor and a proximity sensor, among which the ambient light sensor may adjust the brightness of the display panel 1041 according to ambient lights. The proximity sensor may turn off the display panel 1041 and/or backlight when the mobile phone reaches nearby the ear. As a kind of motion sensor, a accelerometer sensor can detect the magnitude of acceleration in all directions and when the mobile phone is stationary, the accelerometer sensor can detect the magnitude and direction of gravity; the accelerometer sensor can also be configured for applications related to identification of mobile-phone gestures (such as vertical and horizontal screen switch), vibration-recognition related functions (such as a pedometer, percussion), and so on. The mobile phone can also be equipped with a gyroscope, a barometer, a hygrometer, a thermometer, an infrared sensor, and other sensors.

The audio circuit 1060, a speaker 1061, and a microphone 1062 may provide an audio interface between the user and the mobile phone. The audio circuit 1060 may convert the received audio data to electrical signals and transfer the electrical signals to the speaker 1061; thereafter the speaker 1061 converts the electrical signals to sound signals to output. On the other hand, the microphone 1062 converts the received sound signals to electrical signals, which will be received and converted to audio data by the audio circuit 1060 to output. The audio data is then processed by the processor 1080 and transmitted via an RF circuit 1010 to another mobile phone. Alternatively, the audio data is output to the memory 1020 for further processing.

Wi-Fi belongs to a short-range wireless transmission technology. With aid of the Wi-Fi module 1070, the mobile phone can assist the user in receiving and sending an E-mail, browsing through webpage, accessing streaming media, and the like. Wi-Fi provides users with wireless broadband Internet access. Although the Wi-Fi module 1070 is illustrated in FIG. 10, it should be understood that the Wi-Fi module 1070 is not necessary to the mobile phone 1000 and can be omitted according to actual needs.

The processor 1080 is a control center of the mobile phone. The processor 1080 connects various parts of the entire mobile phone through various interfaces and lines. By running or executing software programs and/or modules stored in the memory 1020 and calling data stored in the memory 1020, the processor 1080 can execute various functions of the mobile phone and conduct data processing, so as to monitor the mobile phone as a whole. The processor 1080 can include at least one processing unit. In an embodiment, the processor 1080 can integrate an application processor and a modem processor, where the application processor is mainly configured to handle an operating system, a user interface, applications, and so on and the modem processor is mainly configured to deal with wireless communication. It will be appreciated that the modem processor mentioned above may not be integrated into the processor 1080. For example, the processor 1080 can integrate an application processor and a baseband processor, and the baseband processor and other peripheral chips can form a modem processor. The mobile phone 1000 further includes a power supply 1090 (such as a battery) that supplies power to various components. For instance, the power supply 1090 may be logically coupled to the processor 1080 via a power management system to enable management of charging, discharging, and power consumption through the power management system.

In one implementation, the mobile phone 1000 can include a camera, a Bluetooth® module, and so on.

In the embodiment of the present disclosure, the processor 1080 included in the mobile phone implements the method for sound effect compensation described above when executing computer programs stored in the memory.

Embodiments of the disclosure further provide an audio processing device, which includes an electroacoustic transducer, a memory, a processor, and computer programs stored in the memory. The processor is electrically coupled with the electroacoustic transducer and the memory, and the processor invokes the computer programs to perform the method for sound effect compensation.

In one implementation, the processor is a digital signal processing chip and integrates the functions of an EQ.

In one implementation, the electroacoustic transducer is configured to play an audio signal and further configured to record an acoustic echo signal formed by reflection and vibration of the audio signal and an noise signal through the ear canal.

In one implementation, the electroacoustic transducer includes a speaker and a microphone. Based on such configuration, the speaker is configured to play the audio signal, and the microphone is configured to record the acoustic echo signal formed by reflection and vibration of the audio signal through the ear canal.

In one implementation, the speaker is integrated with the microphone.

Any reference to a memory, storage, database, or other medium used herein can include non-transitory and/or transitory memory. Suitable non-transitory memories can include ROM, programmable ROM (PROM), electrically programmable ROM (EPROM), electrically erasable programmable ROM (EEPROM), or flash memory. Transitory memory can include RAM, which acts as an external cache. By way of illustration and not limitation, RAM is available in a variety of formats, such as static RAM (SRAM), dynamic RAM (DRAM), synchronous DRAM (SDRAM), double data rate SDRAM (DDR SDRAM), enhanced SDRAM (ESDRAM), synchronization link DRAM (SLDRAM), Rambus direct RAM (RDRAM), direct Rambus dynamic RAM (DRDRAM), and Rambus dynamic RAM (RDRAM).

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for sound effect compensation, comprising:
acquiring an audio signal output from an audio processing device;
recording an acoustic echo signal formed by reflection and vibration of the audio signal through an ear canal;
determining an acoustic transmission function of the audio processing device in the ear canal of a user according to the audio signal output from the audio processing device and the acoustic echo; and
compensating for the audio signal according to the acoustic transmission function.

2. The method of claim 1, wherein the compensating for the audio signal according to the acoustic transmission function comprises:
determining a monitoring frequency-response curve of the audio processing device according to the acoustic transmission function; and
compensating for the audio signal by adjusting the monitoring frequency-response curve according to a standard frequency-response curve.

3. The method of claim 2, wherein the determining a monitoring frequency-response curve of the audio processing device according to the acoustic transmission function comprises:
acquiring a corresponding relationship among acoustic echo signals, acoustic transmission functions, and monitoring frequency-response curves; and
determining the monitoring frequency-response curve of the audio processing device in the ear canal of the user according to the acoustic transmission function and the corresponding relationship.

4. The method of claim 2, wherein the compensating for the audio signal by adjusting the monitoring frequency-response curve according to a standard frequency-response curve comprises:
determining difference data between the standard frequency-response curve and the monitoring frequency-response curve; and
adjusting gain parameters of an equalizer according to the difference data, the gain parameters comprising a gain frequency point and a gain value, and the equalizer being disposed in the audio processing device.

5. The method of claim 4, wherein the determining difference data between the standard frequency-response curve and the monitoring frequency-response curve comprises:
judging whether a difference between a gain value corresponding to the standard frequency-response curve and a gain value corresponding to the monitoring frequency-response curve at a same frequency point is within a preset range; and
determining the difference as the difference data, based on a judgment that the difference is not within the preset range.

6. The method of claim 1, wherein the compensating for the audio signal according to the acoustic transmission function comprises:
acquiring stored acoustic transmission functions and compensation data of the audio processing device in ear canals of different users;
acquiring corresponding compensation data according to the acoustic transmission function; and
compensating for the audio signal according to the compensation data.

7. The method of claim 1, further comprising:
acquiring age information of the user according to the acoustic transmission function; and
adjusting sound effects of the audio signal subject to the compensating according to the age information.

8. A terminal device, comprising:
at least one processor; and
a computer readable storage, coupled to the at least one processor and storing at least one computer executable instruction thereon which, when executed by the at least one processor, cause the at least one processor to carry out actions, comprising:

determining an acoustic transmission function of an audio processing device in an ear canal of a user according to an audio signal output from the audio processing device;
acquiring stored acoustic transmission functions and compensation data of the audio processing device in ear canals of different users;
acquiring corresponding compensation data according to the acoustic transmission function; and
compensating for the audio signal according to the compensation data.

9. The terminal device of claim 8, wherein the at least one processor carrying out the action of compensating for the audio signal according to the acoustic transmission function is caused to carry out actions, comprising:
determining a monitoring frequency-response curve of the audio processing device according to the acoustic transmission function; and
compensating for the audio signal by adjusting the monitoring frequency-response curve according to a standard frequency-response curve.

10. The terminal device of claim 8, wherein the at least one processor carrying out the action of determining the acoustic transmission function of the audio processing device in the ear canal of the user according to the audio signal output from the audio processing device is caused to carry out actions, comprising:
acquiring the audio signal output from the audio processing device;
recording an acoustic echo signal formed by reflection and vibration of the audio signal through the ear canal; and
determining the acoustic transmission function of the audio processing device in the ear canal of the user according to the audio signal and the acoustic echo signal.

11. The terminal device of claim 9, wherein the at least one processor carrying out the action of determining the monitoring frequency-response curve of the audio processing device according to the acoustic transmission function is caused to carry out actions, comprising:
acquiring a corresponding relationship among acoustic echo signals, acoustic transmission functions, and monitoring frequency-response curves; and
determining the monitoring frequency-response curve of the audio processing device in the ear canal of the user according to the acoustic transmission function and the corresponding relationship.

12. The terminal device of claim 9, wherein the at least one processor carrying out the action of compensating for the audio signal by adjusting the monitoring frequency-response curve according to the standard frequency-response curve is caused to carry out actions, comprising:
determining difference data between the standard frequency-response curve and the monitoring frequency-response curve; and
adjusting gain parameters of an equalizer according to the difference data, the gain parameters comprising a gain frequency point and a gain value, and the equalizer being disposed in the audio processing device.

13. The terminal device of claim 12, wherein the at least one processor carrying out the action of determining the difference data between the standard frequency-response curve and the monitoring frequency-response curve is caused to carry out actions, comprising:
judging whether a difference between a gain value corresponding to the standard frequency-response curve and a gain value corresponding to the monitoring frequency-response curve at a same frequency point is within a preset range; and
determining the difference as the difference data, based on a judgment that the difference is not within the preset range.

14. The terminal device of claim 8, wherein the at least one processor is further caused to carry out actions, comprising:
acquiring age information of the user according to the acoustic transmission function; and
adjusting sound effects of the audio signal subject to the compensating according to the age information.

15. A non-transitory computer-readable storage medium storing a computer program which, when executed by a processor, causes the processor to carry out actions, comprising:
determining an acoustic transmission function of an audio processing device in an ear canal of a user according to an audio signal currently output from the audio processing device;
compensating for the audio signal according to the acoustic transmission function;
acquiring age information of the user according to the acoustic transmission function; and
adjusting sound effects of the audio signal subject to the compensating according to the age information.

16. The non-transitory computer-readable storage medium of claim 15, wherein the computer program which, when executed by a processor, causing the processor to carry out actions of compensating for the audio signal according to the acoustic transmission function, causes the processor to carry out actions, comprising:
determining a monitoring frequency-response curve of the audio processing device according to the acoustic transmission function; and
compensating for the audio signal by adjusting the monitoring frequency-response curve according to a standard frequency-response curve.

17. The non-transitory computer-readable storage medium of claim 15, wherein the computer program which, when executed by a processor, causing the processor to carry out actions of compensating for the audio signal according to the acoustic transmission function, causes the processor to carry out actions, comprising:
acquiring stored acoustic transmission functions and compensation data of the audio processing device in ear canals of different users;
acquiring corresponding compensation data according to the acoustic transmission function; and
compensating for the audio signal according to the compensation data.

* * * * *